US010204820B2

(12) United States Patent
Emory et al.

(10) Patent No.: US 10,204,820 B2
(45) Date of Patent: Feb. 12, 2019

(54) MULTI-SIZE ADAPTABLE SPIN CHUCK SYSTEM

(71) Applicant: Cost Effective Equipment LLC, Rolla, MO (US)

(72) Inventors: Kirk Emory, Rolla, MO (US); Brandon Wilson, Rolla, MO (US); Roger Ruesing, Rolla, MO (US)

(73) Assignee: Cost Effective Equipment LLC, Rolla, MO (US)

( * ) Notice: Subject to any disclaimer, the term of this patent is extended or adjusted under 35 U.S.C. 154(b) by 26 days.

(21) Appl. No.: 14/716,143

(22) Filed: May 19, 2015

(65) Prior Publication Data

US 2015/0336127 A1    Nov. 26, 2015

Related U.S. Application Data

(60) Provisional application No. 62/001,430, filed on May 21, 2014.

(51) Int. Cl.
*H01L 21/687* (2006.01)
*B05D 1/00* (2006.01)
(Continued)

(52) U.S. Cl.
CPC .. *H01L 21/68785* (2013.01); *H01L 21/68792* (2013.01); *B05C 11/08* (2013.01);
(Continued)

(58) Field of Classification Search
CPC . B05D 1/005; H01L 51/003; H01L 21/02282; H01L 21/0276; H01L 21/67051;
(Continued)

(56) References Cited

U.S. PATENT DOCUMENTS 4,036,171 A * 7/1977 Ramet ............... C23C 14/042
                                                  118/720
4,075,974 A * 2/1978 Plows ................ B05C 11/08
                                                  118/320
(Continued)

FOREIGN PATENT DOCUMENTS

JP        8-316294      11/1996
JP        2005-032913    2/2005

OTHER PUBLICATIONS

Headway o-ringchuck, 1 page.
(Continued)

*Primary Examiner* — Karl Kurple
(74) *Attorney, Agent, or Firm* — Hovey Williams LLP

(57) ABSTRACT

A novel interchangeable spin chuck system is provided that allows the user to quickly change substrate sizes and spin chuck styles without any extra tools. This system has a two-piece design and overcomes many of the drawbacks of previous spin chuck designs, such as difficulty in seating the spin chuck and ensuring that the spin chuck is at a consistent flatness and height. Furthermore, this spin chuck system allows the spin chucks to be manufactured at a lower cost. Thus, rather than restricting users to "make do" with incorrect spin chucks due to budget limitations, this economical design gives users access to a wider range of spin chuck sizes and styles.

4 Claims, 11 Drawing Sheets

(51) Int. Cl.
*G03F 7/16* (2006.01)
*B05C 11/08* (2006.01)
*B05C 13/02* (2006.01)
*H01L 21/67* (2006.01)

(52) U.S. Cl.
CPC .............. *B05C 13/02* (2013.01); *B05D 1/005* (2013.01); *G03F 7/162* (2013.01); *H01L 21/6715* (2013.01); *Y10T 29/50* (2015.01); *Y10T 279/11* (2015.01)

(58) Field of Classification Search
CPC ....... H01L 2224/03416; H01L 2224/17; H01L 2224/18; H01L 21/68721; H01L 21/68792; H01L 21/68785
USPC .................. 118/728–733; 156/345.51–345.55
See application file for complete search history.

(56) References Cited

U.S. PATENT DOCUMENTS

| | | | | |
|---|---|---|---|---|
| 4,086,870 A * | 5/1978 | Canavello | ............... | B05C 11/08 118/503 |
| 5,468,299 A * | 11/1995 | Tsai | ........................ | C30B 25/12 108/138 |
| 5,610,529 A * | 3/1997 | Schwindt | ............... | G01R 19/32 324/750.03 |
| 5,658,231 A * | 8/1997 | Schmitt | ..................... | B04B 7/00 279/131 |
| 5,683,518 A * | 11/1997 | Moore | ................ | C23C 16/4404 118/50.1 |
| 5,769,945 A * | 6/1998 | Davis | ..................... | B05C 11/08 118/319 |
| 5,795,448 A * | 8/1998 | Hurwitt | ............... | H01L 21/6715 118/729 |
| 5,840,365 A * | 11/1998 | Ebert | ..................... | B05C 11/08 427/240 |
| 5,861,061 A * | 1/1999 | Hayes | ..................... | G03F 7/162 118/319 |
| 5,985,031 A * | 11/1999 | Davis | ..................... | G03F 7/162 118/500 |
| 6,140,253 A * | 10/2000 | Hayes | ............... | H01L 21/67075 118/52 |
| 6,328,096 B1 * | 12/2001 | Stone | ................ | H01L 21/67103 118/728 |
| 6,372,048 B1 * | 4/2002 | Futamura | .......... | H01L 21/67103 118/724 |
| 6,454,277 B1 * | 9/2002 | Yu | ........................ | B23B 31/201 279/49 |
| 7,276,118 B2 * | 10/2007 | Lim | .................. | H01L 21/68721 118/320 |
| 2003/0046786 A1 | 3/2003 | Shirley et al. | | |
| 2006/0132154 A1 * | 6/2006 | Uher | .................... | G01R 1/0491 324/750.06 |
| 2006/0180968 A1 * | 8/2006 | Kim | .................. | H01L 21/68785 269/51 |
| 2006/0186611 A1 * | 8/2006 | Gehret | ................ | B23B 31/1238 279/62 |
| 2007/0266935 A1 * | 11/2007 | Lee | .................... | H01L 21/67288 118/52 |
| 2008/0152821 A1 * | 6/2008 | Gardner | ..................... | B41J 2/04 427/421.1 |
| 2009/0151480 A1 | 6/2009 | Sakurai et al. | | |
| 2013/0315802 A1 | 11/2013 | Manian et al. | | |
| 2014/0123597 A1 * | 5/2014 | Mallett | ................. | B67B 3/2066 53/317 |
| 2015/0027366 A1 * | 1/2015 | Horino | .............. | H01L 21/68735 118/500 |
| 2015/0211122 A1 * | 7/2015 | Chang | ..................... | G06F 17/18 156/345.27 |

OTHER PUBLICATIONS

MTI Spin Chucks, 1 page.
Polos Press on Fragment Adapter, 1 page.
Polos Adapter Installed, 1 page.
Laurell fragment-adapter-side _I, 1 page.
Laurell adapter-05_I, 1 page.
Spin Processor Models—Spin Processor Chucks, www.spincoating.com, web page printed Jun. 9, 2015, 2 pages.
Spin Coater Chucks—Laurell Technologies, 2010-2015 Laurell Technologies Corporation, www.laurell.com/chucks, web page printed Jun. 9, 2015, 5 pages.
Brewer Science® Cee® Equipment, Spin Chuck Designs, www.brewerscience.com, Dec. 5, 2012, 6 pages.
International Search Report and Written Opinion dated Aug. 28, 2015 in corresponding PCT/US2015/031560 filed May 19, 2015.
Machine translation in English of JP8-316294, 16 pages.
Machine translation in English of JP2005-032913, 14 pages.

* cited by examiner

MULTI-SIZE ADAPTABLE SPIN CHUCK SYSTEM

RELATED APPLICATION

This application claims the priority benefit of U.S. Provisional Patent Application No. 62/001,430, entitled MULTI-SIZE ADAPTABLE SPINCHUCK SYSTEM, filed May 21, 2014, each of which is incorporated by reference herein.

BACKGROUND OF THE INVENTION

Field of the Invention

The present invention is directed to a novel spin chuck system having interchangeable spin chucks of varying sizes. The system is designed for easy adaptation to accommodate the wide variety of substrates utilized in spin-coating processes.

Description of the Prior Art

When spin coating substrates, especially microelectronic substrates, the substrate must be held securely while spinning. Typically, this is achieved by using a spin chuck (also called a "spin coater chuck"), which holds the substrate in place using vacuum and/or physical tension. Vacuum is transferred to the substrate via grooves or holes in the spin chuck that are connected to a vacuum source, usually through an opening in the spindle of the spin coater.

It is often beneficial to be able to use multiple sizes of spin chucks on a single spin coater. This allows multiple-sized substrates to be coated on the same piece of equipment. Different spin coater models use different methods to enable the user to change the spin chuck on the tool. Some spin chucks use a screw in the center of the spin chuck to attach the spin chuck to the top of the spindle. Often, this screw has a hole through the middle that allows vacuum to be pulled across the surface of the spin chuck and down through the spindle of the spin coater. This design requires a screwdriver or allen wrench in order to change the spin chuck, and also creates a recessed area in the center of the spin chuck that can cause a dimple in the center of the substrate when vacuum is pulled. Because the specialized screw is also easily lost, especially down the drain port of the spin coater, the screw itself can cause delays. Other spin chucks slip over the spindle and use some sort of mechanism for locking it to the spindle and/or o-rings in order to transfer vacuum and hold the spin chuck in place. However, these designs have drawbacks because it can be difficult to see if a spin chuck is seated correctly, and chemical or wear damage to the o-rings can cause vacuum or process failure. Additionally, different spin chucks may be machined to different heights or may sit at different heights due to the installation technique, potentially causing variations in coating quality and thickness.

SUMMARY OF THE INVENTION

The present invention provides a novel spin chuck assembly that overcomes the foregoing problems. The assembly comprises a base having upper and lower ends, with the base having an opening at the lower end. The opening is configured to allow a spindle to be positioned therein. The spin chuck has upper and lower sides, with the upper side being configured to support a substrate, and the lower side being removably connected to the base upper end. The spin chuck is not removable from the base by a force of less than about 5 in·lbs being applied to one of the spin chuck and base.

A method of utilizing an adaptable spin chuck assembly is also provided. The method comprises attaching a base having upper and lower ends to a spindle. The base has an opening at the lower end, and the opening receives the spindle therein. A spin chuck having upper and lower sides is attached to the base upper end. A substrate is placed on the spin chuck upper surface.

In a further embodiment, a spin chuck assembly kit is also provided. The kit comprises a base having upper and lower ends, with the base having an opening at the lower end. The opening is configured to receive a spindle therein. The kit also comprises a plurality of spin chucks that are configured to support a substrate. The spin chucks each have lower sides that are similarly configured to be removably connected to the base upper end. Finally, the kit comprises a storage area, with the base and each spin chuck being contained in the storage area.

In yet a further embodiment, a spin chuck comprising upper and lower sides is provided. The spin chuck has an annular platform extending from the lower side, and the platform has an inner threaded surface that is configured to be screwed to a base having corresponding threads. The spin chuck upper side is configured to support and secure a substrate thereto during a spin-coating process.

DETAILED DESCRIPTION OF THE PREFERRED EMBODIMENTS

The present invention overcomes the problems of the prior art by providing a spin chuck system that can be more easily adapted to the particular process being run.

Figure 1:
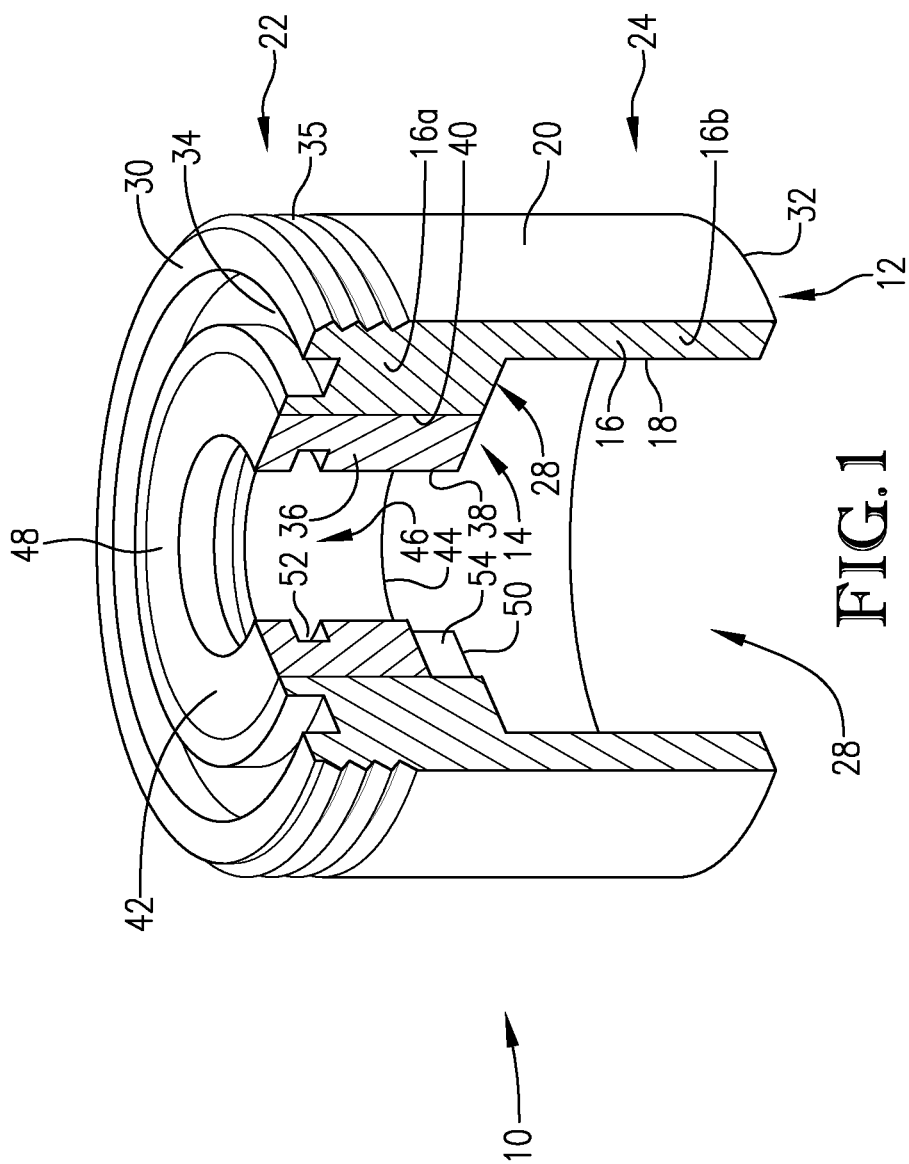
FIG. 1 is a partial sectional view of a base utilized in the inventive spin chuck system.

Turning to FIG. 1, a base 10 comprising a pair of cylindrical bodies, 12, 14 is illustrated. Outer cylindrical body 12 has a wall 16 that has inner and outer surfaces 18, 20, as well as upper and lower ends 22, 24. An opening 26 passes longitudinally through the center of the outer cylindrical body 12. Inner surface 18 has a section 28 that "steps in," so as to present a section 16a of wall 16 that has an increased thickness as compared to the remainder 16b of wall 16. This increased thickness at 16a results in a corresponding narrowing of the diameter of opening 26. Wall 16 of outer cylindrical body 12 further comprises upper and lower surfaces 30, 32 that serve to join inner and outer surfaces 18, 20. Upper surface 30 includes an annular groove 34, where an o-ring (not shown) could be included to ensure a seal between base 10 and the particular spin chuck (described below). Finally, outer cylindrical body 12 includes a threaded region 35 on outer surface 20, at upper end 22.

Outer cylindrical body 12 can be formed of any number of materials having sufficient rigidity, provided that the material will not react with the process chemicals to which it will be exposed during use. Suitable materials include those selected from the group consisting of aluminum, acetal resin, stainless steel, polyetheretherketone (PEEK), polytetrafluorethylene (PTFE), and polyvinylidene fluoride (PVDF).

Inner cylindrical body 14 is a bushing that comprises a wall 36 that has inner and outer surfaces 38, 40, as well as upper and lower ends 42, 44. An opening 46 passes longitudinally through the center of the inner cylindrical body 14. Wall 36 of inner cylindrical body 14 further comprises upper and lower surfaces 48, 50 that serve to join inner and outer surfaces 38, 40. Inner surface 38 includes an annular groove 52, near upper end 42. An o-ring (not shown) could be included in groove 52 to ensure a seal between base 10 and the spindle (described below). Additionally, there is preferably a pin alignment slot 54 formed in inner surface 38, near the lower end 44 of inner cylindrical body 14. As shown in FIG. 1, inner cylindrical body 14 is positioned within outer cylindrical body 12, so that the outer surface 40 of inner cylindrical body 14 is against the inner surface 18 of outer cylindrical body 12. Outer and inner cylindrical bodies 12, 14 are positioned so that their respective upper surfaces 30, 48 lie substantially along the same plane. Additionally, the length and positioning of inner cylindrical body 14 is such that its lower surface 50 coincides with stepped-in section 28, so that inner cylindrical body 14 is adjacent section 16a of wall 16 (i.e., adjacent the area of increased thickness). Inner cylindrical body 14 is typically formed of a metal, and tends to lend greater precision and stability on a spindle.

Figure 2:
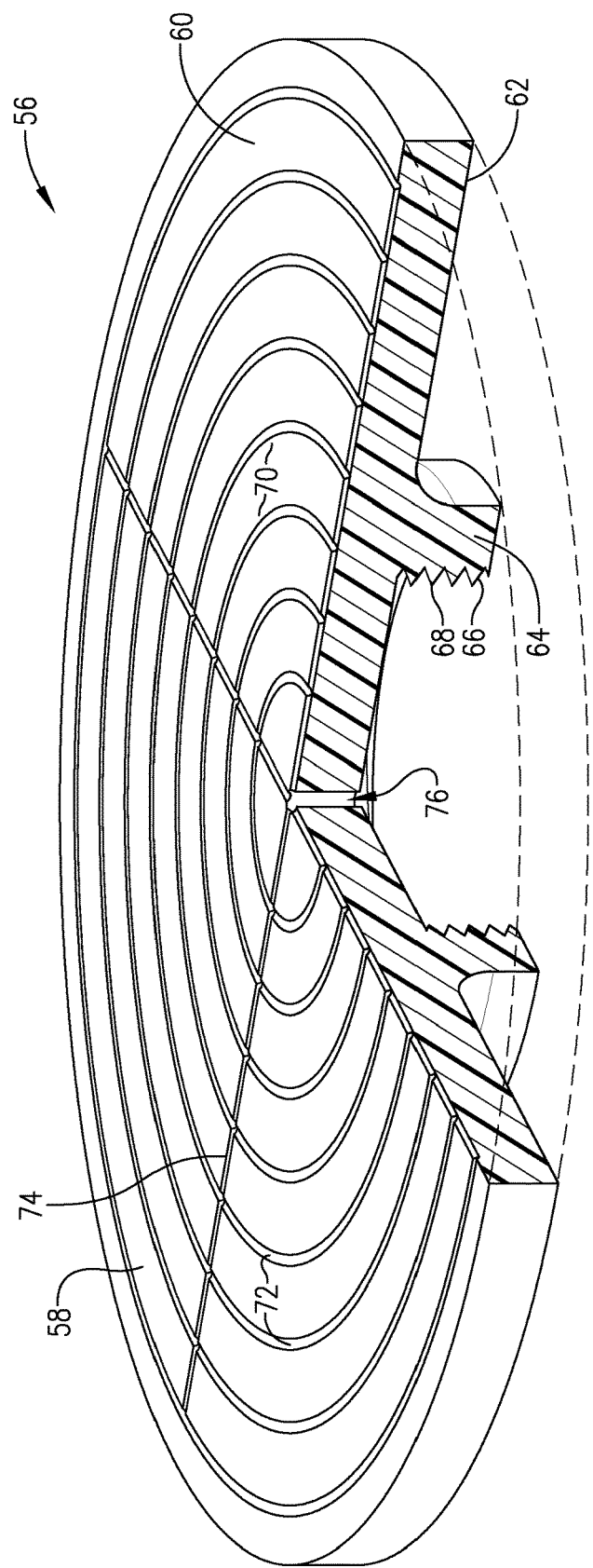
FIG. 2 is a partial sectional view of a spin chuck utilized in the inventive spin chuck system.

Turning to FIG. 2, a spin chuck 56 is depicted. Spin chuck 56 can be formed of the same materials described above with respect to the outer cylindrical body 12. The spin chuck 56 has a platform 58, which has upper and lower sides 60, 62. A lower mount 64 extends from lower side 62. Lower mount 64 has an inner peripheral surface 66 that is equipped with threads 68, designed to mate with threaded region 35 of base 10. Upper side 60 has a surface 70 having a plurality of concentric vacuum grooves 72, as well as radial grooves 74 that connect grooves 72. Finally, the spin chuck 56 has a central vacuum opening 76 that runs the full thickness of platform 58.

Figure 3:
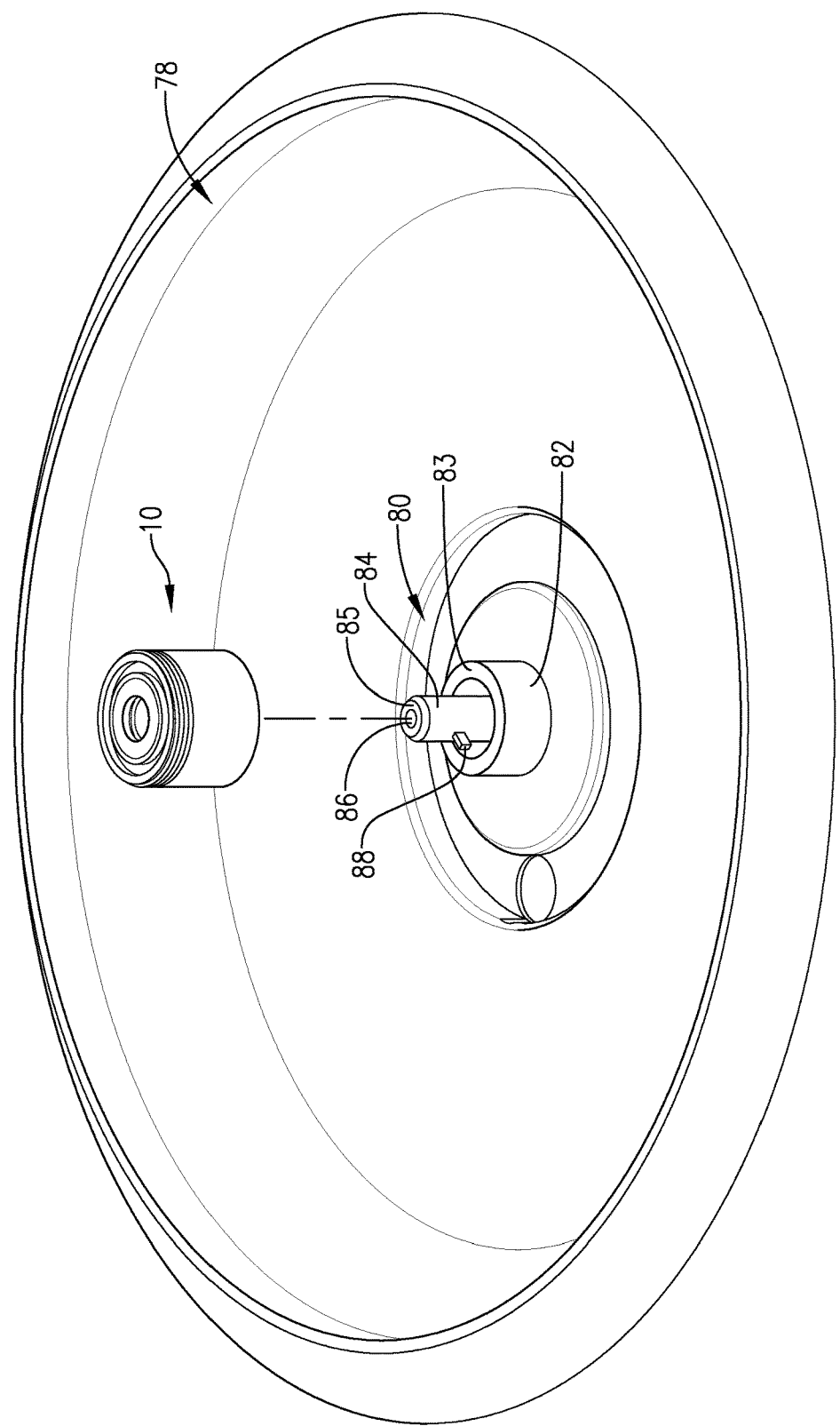
FIG. 3 is a schematic drawing demonstrating the installation of the inventive base onto a typical spin coater spindle assembly.

Advantageously, the inventive spin chuck system can be used with conventional spin coating equipment. Referring to FIG. 3, a typical spin bowl 78 is shown. Spin bowl 78 is equipped with a spindle assembly 80. Spindle assembly 80 includes base support 82 and spindle 84. As illustrated, base support 82 has a top edge 83, and encompasses spindle 84. Spindle 84 includes an upper surface 85, a vacuum port 86, and an alignment pin 88.

In use, the base 10 is slid onto spindle assembly 80, so that spindle 84 passes into opening 26 and then opening 46. The height of the base support 82 of spindle assembly 80 corresponds to that of section 16b of wall 16. Thus, when fully seated, the stepped-in section 28 will be positioned near, but not in contact with, the top edge 83 (see FIG. 4). Additionally, alignment pin 88 will rest within pin alignment slot 54. However, with prior art chucks, proper seating can be difficult to determine as these parts are not visible in use. The present invention remedies this problem by providing an easy visual indicator of proper seating. That is, if the base 10 is fully and properly seated on spindle assembly 80, the upper surface 85 of spindle 84 will lie along substantially the same plane as upper surfaces 30, 48 on base 10.

Figure 4:
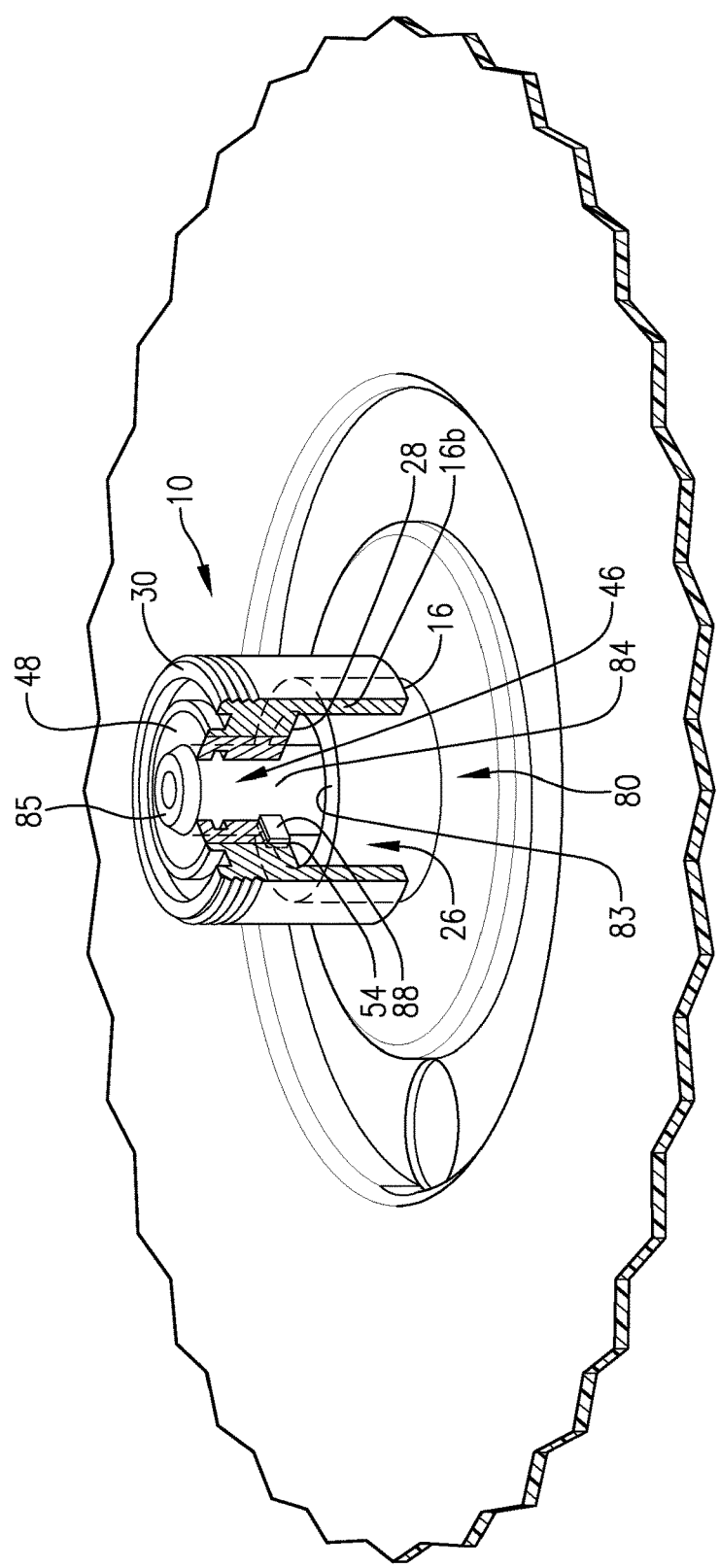
FIG. 4 is a partial sectional view of the inventive base fully seated on the spindle assembly of FIG. 3.
Figure 5:
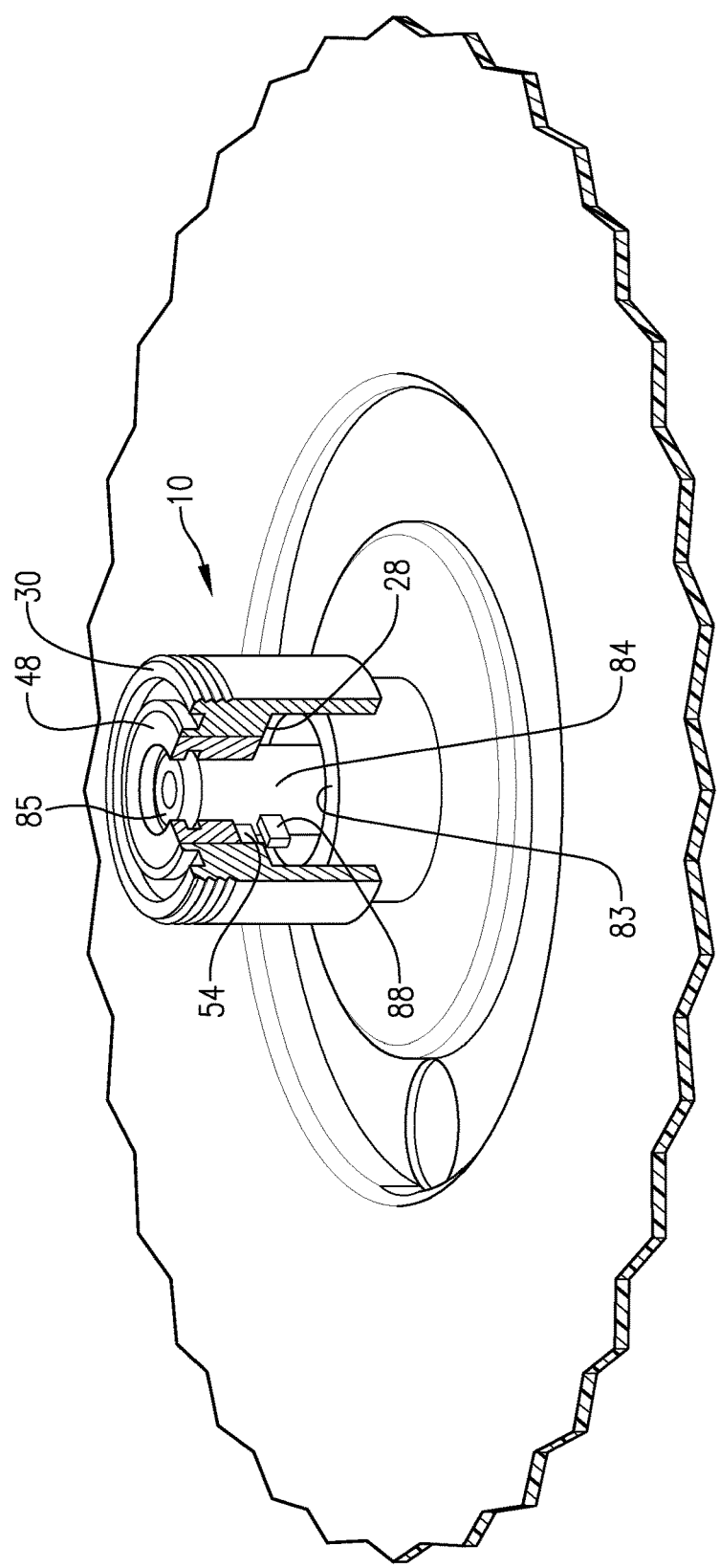
FIG. 5 is a partial sectional view of the inventive base when it is not fully seated on the spindle assembly of FIG. 3.

In contrast to FIG. 4, FIG. 5 shows an improperly seated base 10. In this instance, stepped-in section 28 is not resting on top edge 83, nor is alignment pin 88 positioned within pin alignment slot 54. However, because of the design of the present invention, the user can visually observe that the upper surface 85 of spindle 84 does not lie along substantially the same plane as upper surfaces 30, 48 on base 10. That is, one can observe that the upper surface 85 is lower than the upper surfaces 30, 48, and that adjustments need to be made to arrive at the FIG. 4, fully-seated version.

Once the user has verified that the base 10 is fully and properly seated on spindle assembly 10, the spin chuck 56 can be attached to base 10. Any attachment mechanism can be utilized, provided it secures spin chuck 56 sufficiently to base 10. The attachment should be sufficiently secure that it is not readily separated by a simple hand-pull. Thus, the spin chuck 56 should not be removable from base 10 by a force that is less than about 5 in·lbs, preferably not removable by a force that is less than about 10 in·lbs, and preferably not removable by a force that is less than about 20 in·lbs. Generally, the force required to remove spin chuck 56 from base 10 will be from about 10 in·lbs to about 30 in·lbs. This force can be measured by securing one of the base 10 or spin chuck 56 (such as in a jig or vise), and applying a force to the other of the base 10 and spin chuck 56 with a digital torque wrench, and observing the measurement at which separation occurs. The most preferred attachment mechanism is the use of the illustrated threads.

Figure 6:
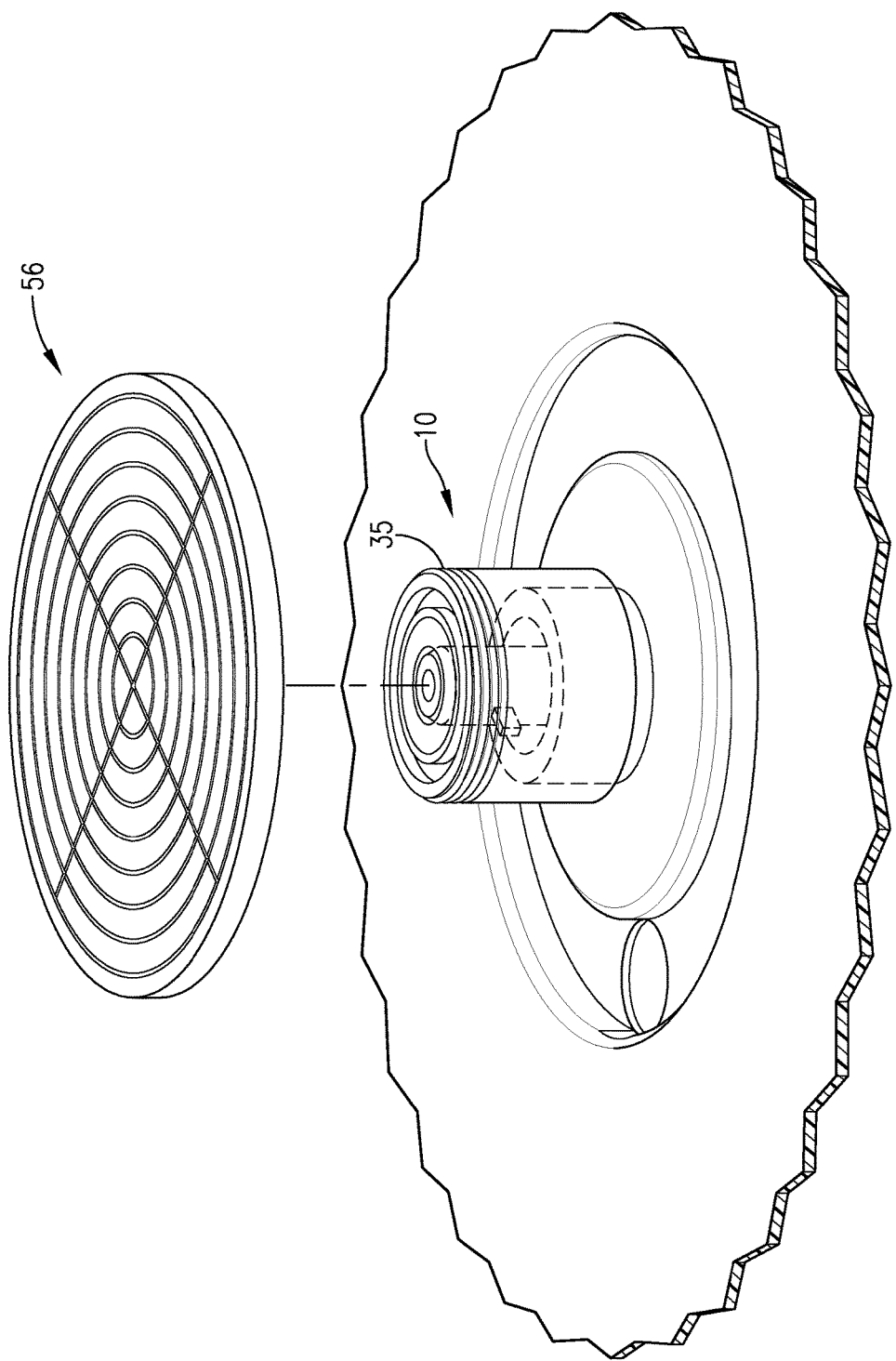
FIG. 6 is a schematic drawing demonstrating the attachment of the inventive spin chuck to the fully-seated inventive base shown in FIG. 4.
Figure 7:
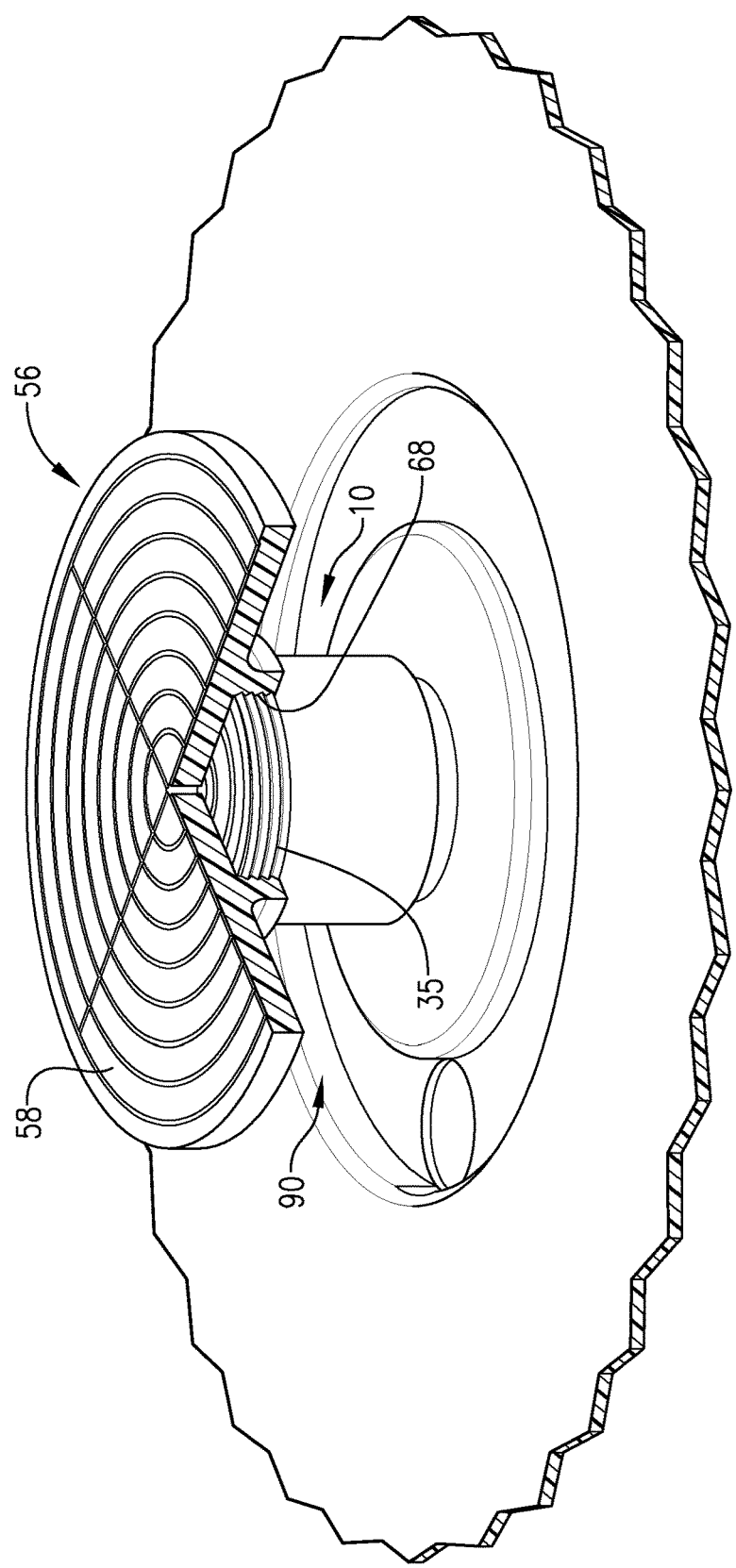
FIG. 7 is a partial sectional view of the inventive spin chuck system fully attached to the spin coater spindle assembly.

Referring to FIG. 6, spin chuck 56 is lowered onto base 10, so that lower mount 64 contacts threaded region 35 of base 10. The spin chuck 56 is turned, causing the threads 68 on spin chuck 56 to interact with threaded region 35 on base 10, thus causing the spin chuck 56 to be screwed onto base 10, and to surround the upper end 22. FIG. 7 illustrates the inventive spin chuck system after fully assembled and attached to the spindle assembly 80, creating spin chuck system 90. At this stage, the desired spincoating process can be carried out by the user. For example, a substrate (not shown; e.g., microelectronic substrate, lens, slide, film) of the desired size can be placed on the platform 58, a vacuum can be pulled through vacuum opening 76, so as to secure the substrate to the platform 58, and spinning and dispensing of the particular coating composition can be carried out.

To remove the spin chuck system 90 from the spindle assembly 80, the user can simply unscrew the spin chuck 56 from the base 10, and then remove the base 10, if desired. Alternatively, the user could lift the entire spin chuck system 90 straight up and off the spindle assembly 80. The spin chuck 56 could then be unscrewed from the base 10, away from the spin coater. The user could then clean the spin chuck 56 or replace it with a new spin chuck. Importantly, special tools are not required for assembly or disassembly, nor are small, easily lost parts (e.g., screws) used in the process.

Figure 8:
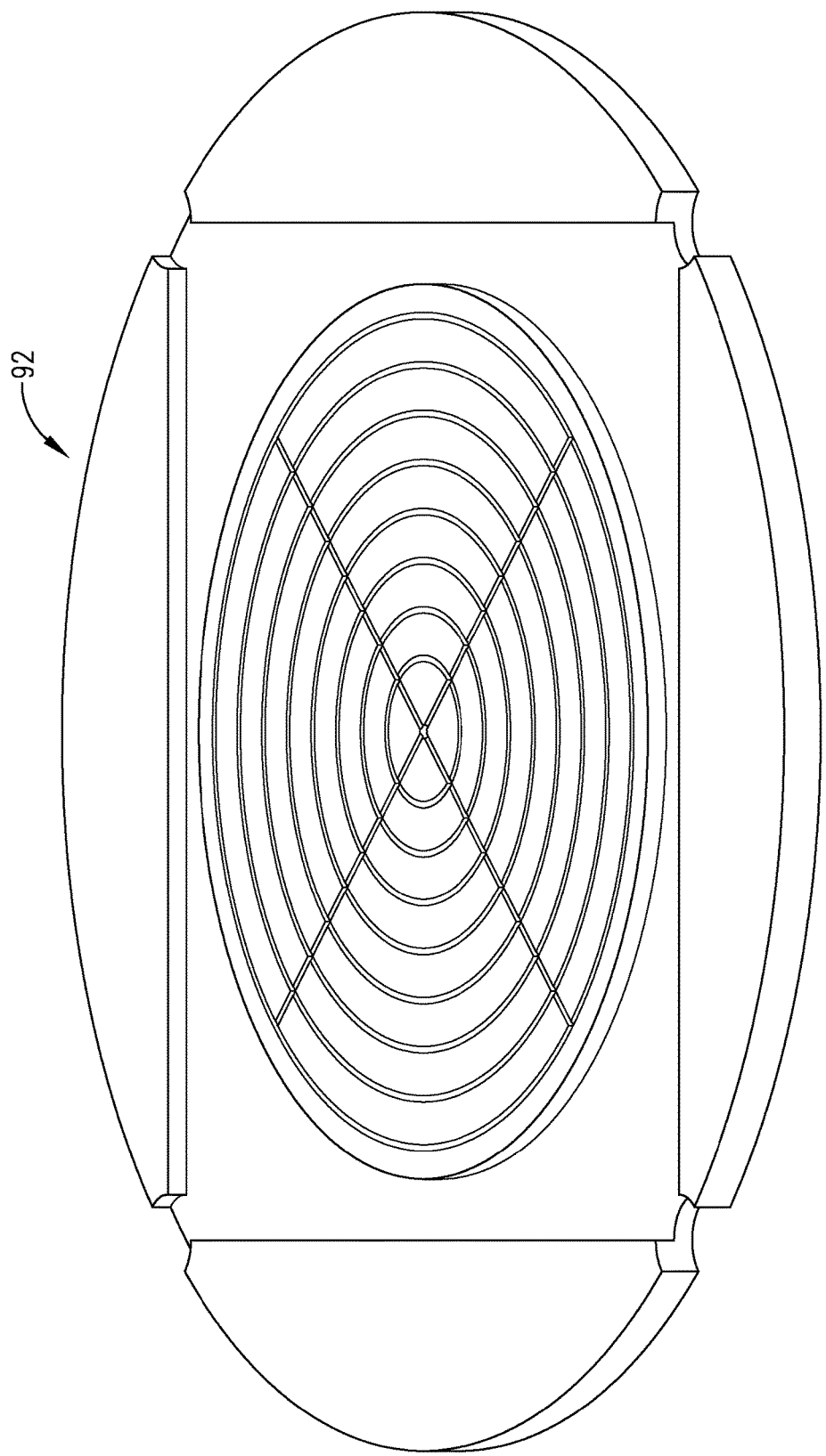
FIG. 8 is a schematic drawing depicting an alternative spin chuck that could be used in the present invention.
Figure 9:
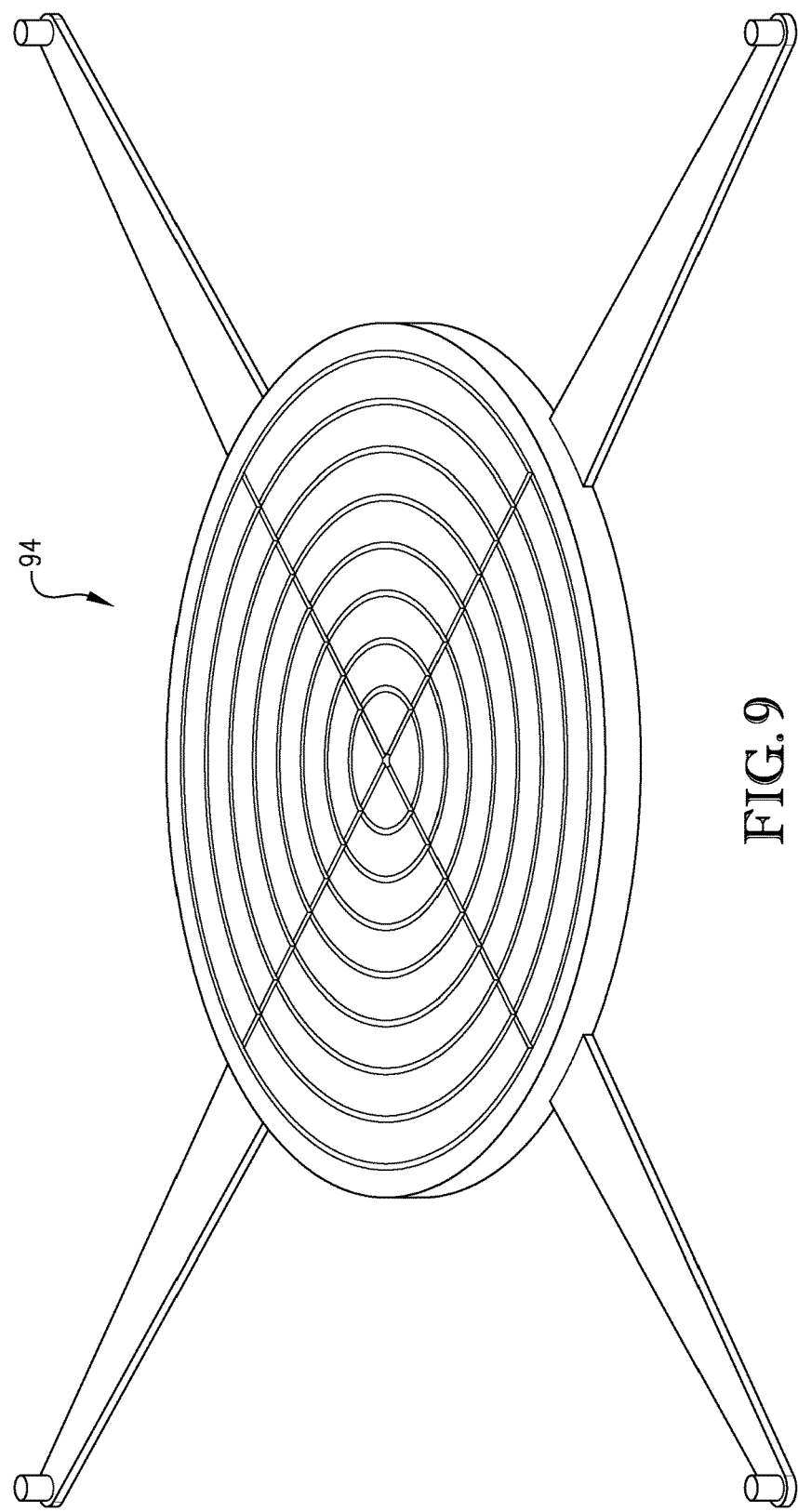
FIG. 9 is a schematic drawing depicting a further alternative spin chuck that could be used in the present invention.

The inventive spin chuck system offers a number of further variations that give it substantial benefits over the prior art. For example, although a typical circular vacuum spin chuck was shown as spin chuck 56, any type of spin chuck can be adapted to work with the present system. For example, FIG. 8 shows a recessed spin chuck 92 that could be formed with the above-described platform 58 and used with the same base 10. Additionally, a captive spin chuck 94 (see FIG. 9) could also be made with a platform 58 and used with the same base 10. This creates a large number of variations that can be achieved using the same base 10, making it much simpler and quicker for the user to make changes to the process while using the same spin coating equipment. In addition to different styles of spin chucks being possible, spin chucks of different sizes (e.g., from about ¼-inch diameter to about 12-inch diameter—typically ⁵⁄₁₆-inch, ½-inch, 1-inch, 2.25-inch, or 4-inch diameters) and shapes can be utilized, thus accommodating a wide range of substrate sizes and shapes. In the case of a standard vacuum chuck, the surface area of the top surface of the spin chuck would be the same size or smaller than the substrate to be processed; however, for recessed or captive spin chucks, the surface area of the top surface of the spin chuck would be the same size or slightly larger than the substrate to be processed.

Figure 10:
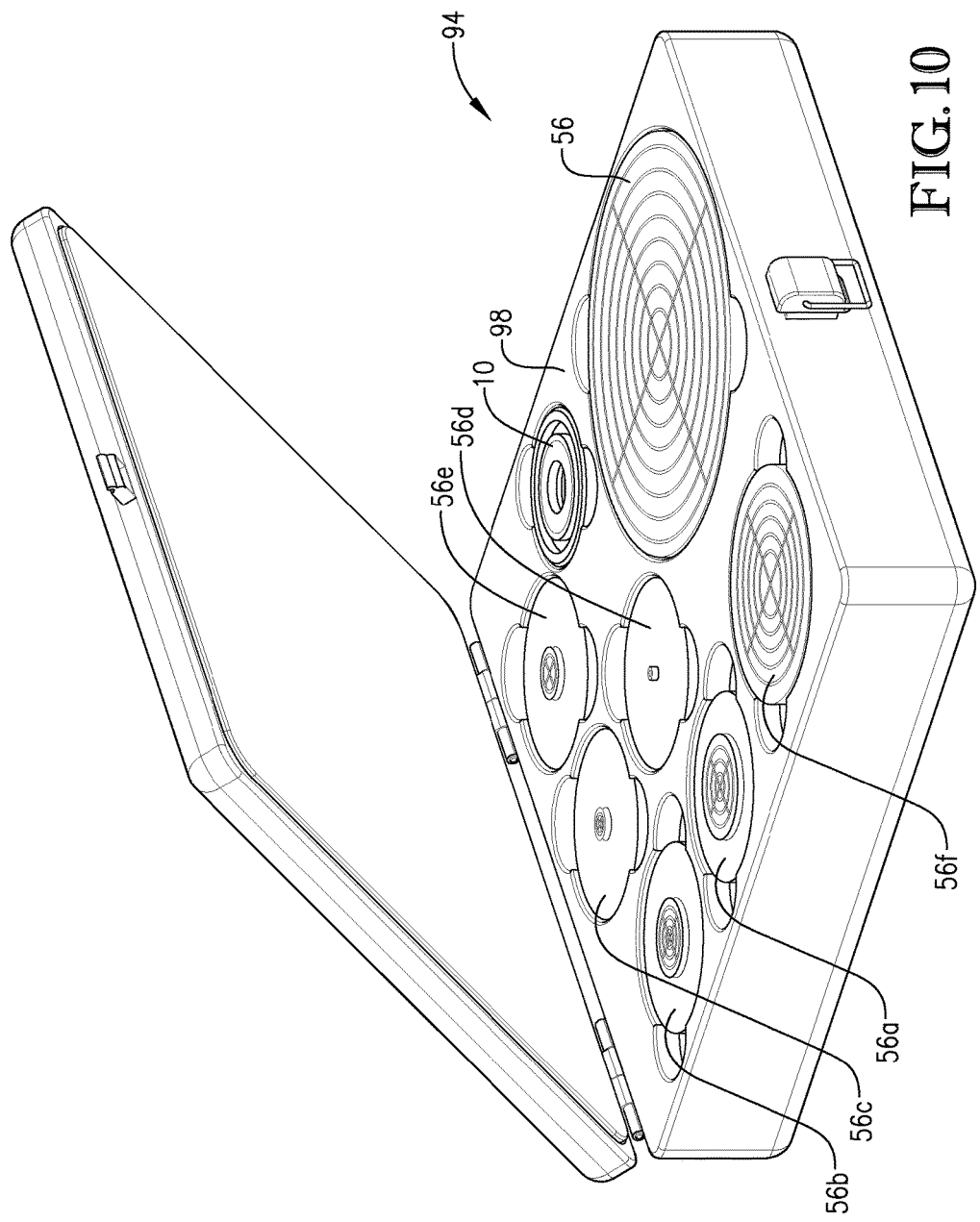
FIG. 10 is a kit having a single base and multiple, interchangeable spin chucks according to the invention.
Figure 11:
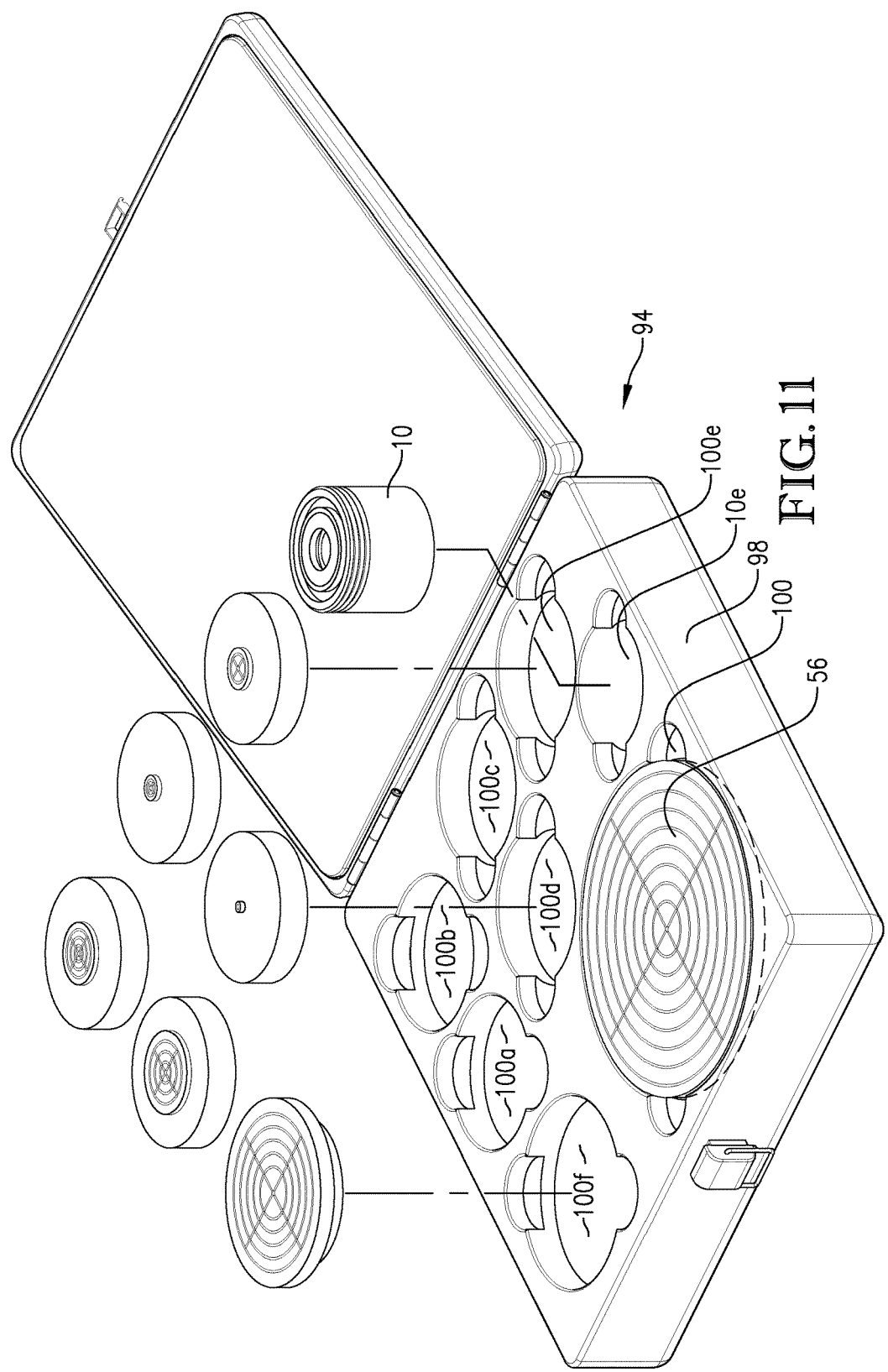
FIG. 11 is the kit of FIG. 10, but showing the storage arrangement of the base and various spin chucks.

Furthermore, towards the end of having a readily adaptable two-part system, the above-described base 10 can be provided as part of a kit 94, with spin chuck 56, as well as a wide variety of other spin chucks 56a-56f of varying sizes and surface types (see FIGS. 10-11). Preferably, there are at least 3 spin chucks, more preferably at least 5 spin chucks, and more preferably at least 7 spin chucks. In one embodiment, no two spin chucks 56, 56a-56f are identical. These can be provided in a case 98 having recessed areas 10e, 100, 100a-100e, which have shapes and sizes corresponding to the base 10 and chucks 56, 56a-56f chosen for the particular kit. Notably, all spin chucks 56, 56a-56f in the kit 94 include a threaded platform 58 that can be attached to the single base 10 included in the system, making the system interchangeable and adaptable.

A significant advantage of the present kit system is that it overcomes prior art problems of different substrate heights. That is, with prior art systems, even after undertaking the cumbersome swapping from one spin chuck to another, the height of the substrate on the spin chuck often varied with each spin chuck. Thus, the distance from the dispense tip to the substrate surface was not consistent, leading to the need for further equipment adjustments or dealing with inconsistently applied compositions. With the present invention, the use of a single base with each spin chuck designed for that base presents a consistent spacing between the substrates and the dispenser tip.

While the above describes a preferred system according to the invention, it will be appreciated that a number of variations can be employed. It was noted that different spin chucks can be utilized. Additionally, different types of spin chuck surfaces, such as a different groove layout or even no grooves but instead a flat surface, can be employed. Also, although the base 10 was shown to be cylindrical in shape, other shapes (including ones of varying diameter from top to bottom) that would fit over the type of spindle assembly being utilized could be employed, provided the shape is weighted so that it can rotate around its z-axis. Of course, the platform 58 of spin chuck 56 would need to be altered to accommodate the different shape of base 10, and done so in a way that still achieves the desired fastened strength.

Also, the above base 10 was described with separate inner and outer cylindrical bodies 12, 14 for certain applications. In other instances, an integrally formed base (i.e., the entire base is made from the same material) can be utilized instead of having two different materials. Suitable materials for this embodiment include those selected from the group consisting of aluminum, acetal resin, stainless steel, PEEK, PTFE, and PVDF, with a particularly preferred material being an acetal resin (e.g., the acetal homopolymer resin sold by DuPont™ under the name DELRIN®).

Finally, while the above describes seating the base 10 and then securing the spin chuck 56 to the base 10, the spin chuck 56 and base 10 could first be screwed together and then placed on the spindle assembly 80. Of course, it would likely be more difficult to seat the base 10 correctly on the spindle assembly 80, and certainly the visual cue described above would no longer be available.

We claim:

1. A spin chuck assembly configured to secure a substrate during a spin-coating process, said spin chuck assembly comprising: a base configured to be seated on a spindle assembly, said base having a base upper end and a base lower end, said base upper end comprising an outer surface and a base threaded region integrally formed on said outer surface, said base having an opening at said base lower end, said opening passing longitudinally through the center of said base and being configured to allow a spindle from said spindle assembly to be positioned therein;

a spin chuck having an upper side and a lower side, said upper side being configured to support the substrate, said lower side comprising a spin chuck threaded region integrally formed thereon and being removably connected to said base threaded region on said outer surface of said base upper end, said spin chuck threaded region being configured to be screwed to said base threaded region so as to removably connect said spin chuck lower side to said base upper end, said spin chuck not being removable from said base by a torque of less than 5 in-lbs being applied to one of said spin chuck and said base.

2. The assembly of claim 1, wherein said lower side includes a platform extending therefrom, and said platform is configured to surround and removably connect to said base upper end.

3. The assembly of claim 2, wherein said platform includes said spin chuck threaded region and said base upper end comprises said base threaded region, said spin chuck threaded region being configured to be screwed to said base threaded region.

4. The assembly of claim 1, further comprising a spin coater comprising said spindle, said spindle being positioned within said base opening.

\* \* \* \* \*